(12) United States Patent
Amick et al.

(10) Patent No.: US 6,566,900 B2
(45) Date of Patent: May 20, 2003

(54) INTEGRATED ON-CHIP PROCESS, TEMPERATURE, AND VOLTAGE SENSOR MODULE

(75) Inventors: Brian Amick, Sunnyvale, CA (US); Claude Gauthier, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/964,680

(22) Filed: Sep. 27, 2001

(65) Prior Publication Data

US 2003/0057986 A1 Mar. 27, 2003

(51) Int. Cl.[7] .............................................. G01R 31/02
(52) U.S. Cl. ...................................... 324/760; 324/158.1
(58) Field of Search ................................. 324/719, 158, 324/754–765; 438/17, 18

(56) References Cited

U.S. PATENT DOCUMENTS

| | | | | | |
|---|---|---|---|---|---|
| 4,281,290 | A | * | 7/1981 | Peacey et al. | 324/426 |
| 4,528,505 | A | * | 7/1985 | Peterson | 324/158 |
| 5,028,863 | A | * | 7/1991 | Negle | 324/158 |
| 5,498,972 | A | * | 3/1996 | Haulin | 324/765 |

* cited by examiner

Primary Examiner—Kamand Cuneo
Assistant Examiner—Paresh Patel
(74) Attorney, Agent, or Firm—Rosenthal & Osha L.L.P.

(57) ABSTRACT

An integrated on-chip process, temperature, and voltage sensor is provided. Further, a method to monitor a process corner, temperature, and voltage on a computer chip is provided. Further, an on-chip voltage monitor is provided. Further, a method to monitor a voltage on a section of a computer chip is provided. Further, an integrated testing module having voltage, temperature, and sensor components is provided.

9 Claims, 2 Drawing Sheets

US 6,566,900 B2

INTEGRATED ON-CHIP PROCESS, TEMPERATURE, AND VOLTAGE SENSOR MODULE

BACKGROUND OF INVENTION

The performance of a computer chip varies with the voltages, temperatures, and process corners at different points on the computer chip. Accurately knowing these parameters helps chip designers understand and improve chip behavior.

FIG. 1a shows a typical computer chip (10), chip package (12), and circuit board (14). The computer chip (10) is made up of several layers of metal (16) that connect circuitry on a substrate of the computer chip (10). These layers of metal (16) are enclosed within the computer chip (10). The computer chip (10) attached to the chip package (12) by, for example, electrically conductive "bumps" (18). The chip package is attached to the circuit board (14) by, for example, larger electrically conductive "bumps" (20).

One approach used by chip designers to monitor chip performance-affecting factors involves embedding one or more circuits in the computer chip, i.e., "on-chip," that sense temperature and find process corners at a point on the chip. Such circuits can be positioned at different points on the computer chip to determine temperature and process parameters at various locations on the computer chip.

FIG. 1b shows a typical implementation of a temperature sensor (30) and process sensor (32) on a computer chip (10). The temperature and process sensors (30, 32) may be positioned at any point of interest on the computer chip (10). Those of ordinary skill in the art will know that there are a wide variety of conventional temperature and process sensors.

In order to monitor voltage on a computer chip, chip designers allocate sense points on the computer chip. These sense points are then attached to a trace, or wire, that leads to an exterior area, such as the circuit board, of the computer chip. However, this type of voltage measurement is prone to inaccuracy because the measurement of the voltage on the chip attenuates as the measurement transfers to the exterior area.

Alternatively, chip designers can physically probe different regions within the computer chip. However, this technique is becoming increasingly difficult because empty space within a computer chip is decreasing as modem computer chips become smaller and more device laden. In cases when physical probing is not feasible, voltage is assumed to be within a certain range.

SUMMARY OF INVENTION

According to one aspect of the present invention, an integrated module for an integrated circuit comprises a voltage sensor, a temperature sensor, and a process sensor.

According to another aspect, a method for monitoring circuit performance using an integrated module comprises monitoring a voltage, monitoring a temperature, and monitoring a process corner.

According to another aspect, an on-chip voltage monitor comprises an input stage comprising a RC voltage divider that generates a divided voltage signal, a buffer stage comprising an operational amplifier that generates a buffered voltage signal based on the divided voltage signal, and an output stage that selectively outputs the buffered voltage signal to an output of the on-chip voltage sensor.

According to another aspect, a method for monitoring a voltage on a section of a computer chip comprises dividing a voltage on the section based on a resistor value to generate a divided voltage signal, buffering the divided voltage signal to generate a buffered divided voltage signal, and selectively outputting the buffered divided voltage signal.

According to another aspect, an on-chip integrated testing module comprises a voltage sensor component, a temperature sensor component, and a process sensor component, where data received from at least one selected from the group consisting of the voltage sensor component, the temperature sensor component, and the process sensor component is used to check performance of an integrated circuit in which the on-chip integrated testing module resides.

According to another aspect, an on-chip integrated module comprises means for measuring a voltage, means for measuring a temperature, and means for measuring a process corner.

Other aspects and advantages of the invention will be apparent from the following description and the appended claims.

BRIEF DESCRIPTION OF DRAWINGS

FIG. 1b shows an implementation of a temperature monitor and process monitor on the computer chip shown in FIG. 1a.

DETAILED DESCRIPTION

The present invention relates to an integrated process, temperature, and voltage sensor. The present invention also relates to a method for using an integrated on-chip module having process, temperature, and voltage monitors. The present invention also relates to an on-chip voltage monitor. The present invention also relates to a method for using an on-chip voltage monitor.

Figure 1A:
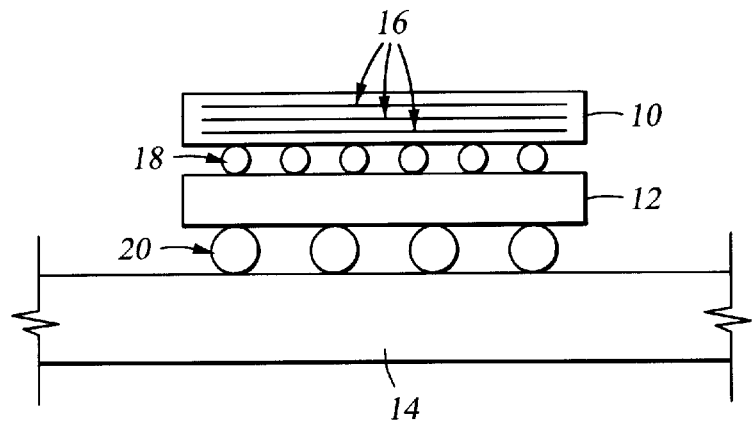
FIG. 1a shows a typical computer chip.
Figure 1B:
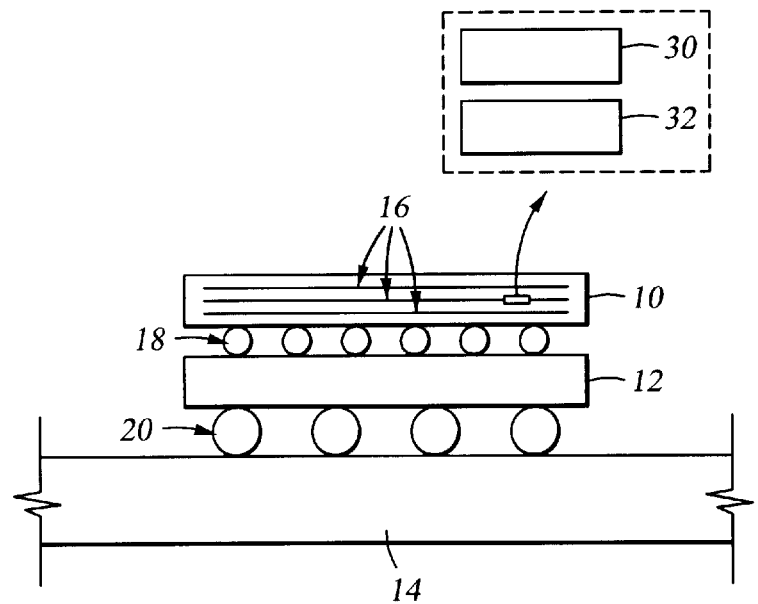
Figure 2:
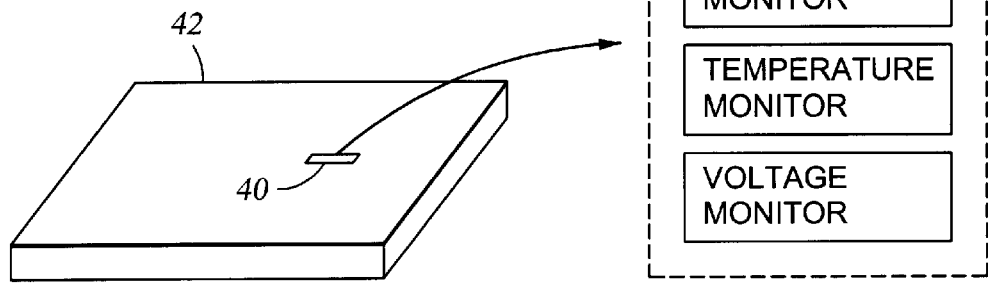
FIG. 2 shows an implementation of an integrated sensor on a computer chip in accordance with an embodiment of the present invention.

FIG. 2 shows an integrated process, temperature, and voltage sensor (40) on a computer chip (42). The integrated process, temperature, and voltage sensor (also referred to as "integrated module") (40) may be positioned on a particular section of the computer chip (42) in order to attain process, temperature, and voltage values at that particular section.

Figure 3:
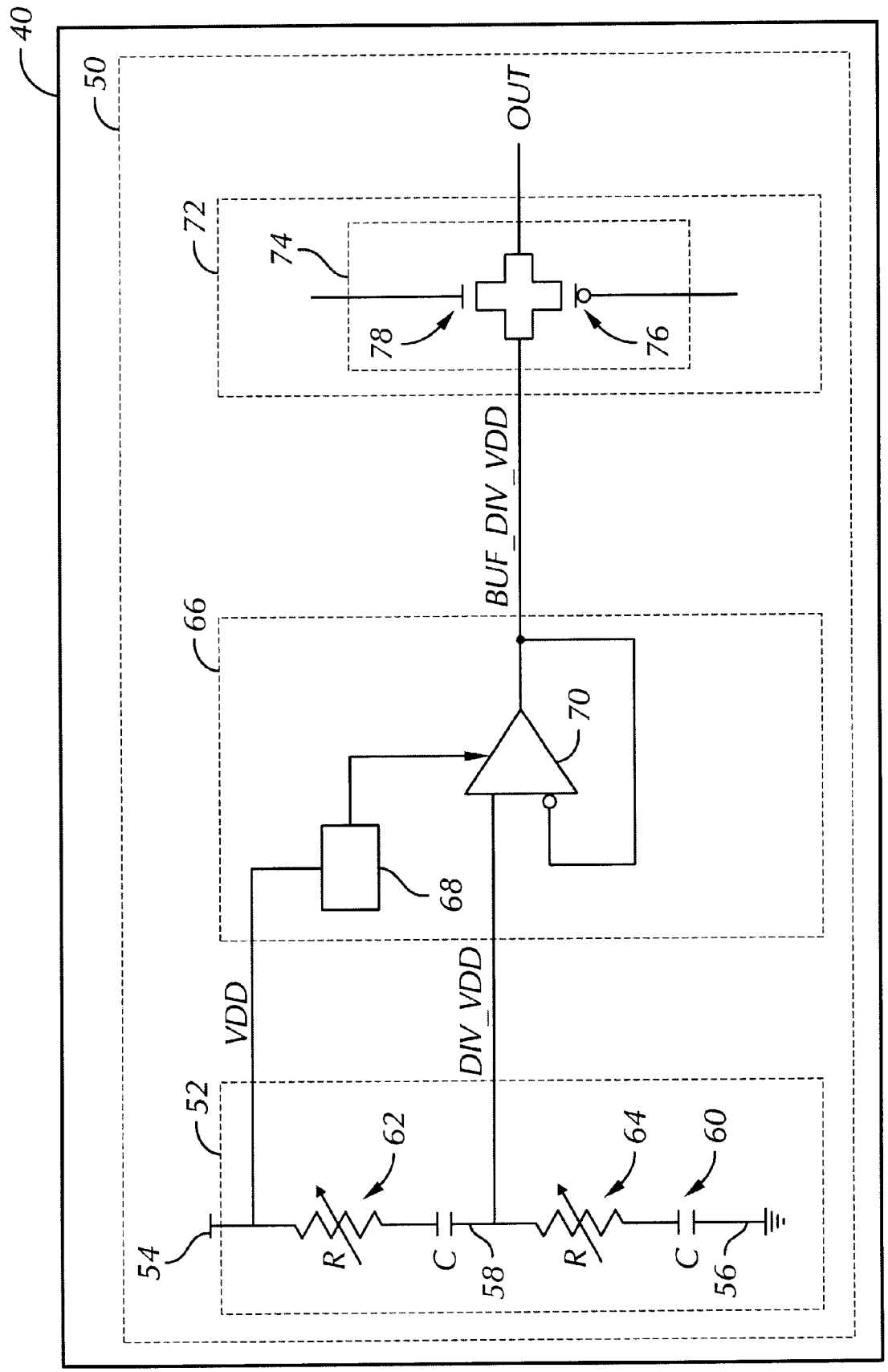
FIG. 3 shows a circuit schematic of a voltage sensor in accordance with an embodiment of the present invention.

FIG. 3 shows an exemplary circuit schematic of a voltage sensor (50) in accordance with an embodiment of the present invention. The voltage sensor (50) has an input stage (52) having a RC voltage divider configuration, between power (54) and ground (56), formed by first and second capacitors (58, 60) and first and second resistors (62, 64). This RC voltage divider configuration allows a circuit designer to adjust resistor values for the first and second resistors (62, 64) in order to cut off voltage division above certain frequencies.

The input stage (52) outputs a voltage high signal, VDD, and a divided voltage signal, DIV_VDD, to a buffer stage (66). The buffer stage (66) has a bias circuit (68) and an operational amplifier (70). The bias circuit (68), which inputs VDD, provides biasing signals to the operational amplifier (70) to ensure proper operation of the operational amplifier (70). The operational amplifier (70) inputs DIV_VDD and outputs a buffered divided voltage signal, BUF_

DIV_VDD. BUFF_DIV_VDD serves as negative feedback for the operational amplifier (70).

The buffer stage (66) outputs BUF_DIV_VDD to an output stage (72). The output stage (72) has a transmission gate (74) formed by a PMOS transistor (76) and NMOS transistor (78). When the transmission gate (74) is 'on,' BUF_DIV_VDD passes to the output, OUT, of the voltage sensor (50). OUT represents the voltage (divided by a certain value) at the point on a computer chip where the voltage sensor (50) resides. Those skilled in the art will appreciate that the voltage sensor (50) shown in FIG. 3 may be used to monitor voltages below a particular desired frequency.

Those skilled in the art will appreciate that the integrated module (40) shown in FIG. 2 has a voltage sensor (50) as shown in FIG. 3 along with conventional temperature and process sensors, where the conventional temperature and process sensors are well known in the art. However, those skilled in the art will appreciate that the use of a voltage sensor with temperature and process sensors in an integrated module for use in a computer chip is a new idea.

In an alternative embodiment of the present invention, an on-chip integrated module having voltage, temperature, and process sensors may be used for testing and debugging purposes. For example, a chip designer can position the integrated module to gather voltage, temperature, and/or process data from a section of a microprocessor or other integrated circuit. This data may then be used to check performance, debug problems, and/or make modifications in the design of the integrated circuit. Thus, the present invention relates to an on-chip integrated testing module having voltage, temperature, and process sensor components.

Advantages of the present invention may include one or more of the following. In some embodiments, because an on-chip voltage monitor may measure voltage at a particular section of a computer chip, voltage supply performance at that particular section may be determined.

In some embodiments, because an on-chip voltage monitor may measure voltage at one or more sections of a computer chip, chip decoupling needs and grid resistances may be determined, effectively giving chip designers information leading to improved chip design and performance.

In some embodiments, because an on-chip integrated module has process, temperature, and voltage sensors, previously unknown parameters related to chip performance may be found at one or more sections of a computer chip.

In some embodiments, because on-chip voltage may be determined using an on-chip voltage monitor, improved process and temperature measurements may be attained.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated module for an integrated circuit, comprising:
    a voltage sensor, comprising:
        an input stage, wherein the input stage comprises a voltage divider, and wherein the input stage generates a divided voltage signal based on the voltage divider,
        a buffer stage, wherein the buffer stage inputs the divided voltage signal and outputs a buffered divided voltage signal, and
        an output stage, wherein the output stage comprises a transmission gate, and wherein the output stage inputs the buffered divided voltage signal and outputs the buffered divided voltage signal based on the transmission gate;
    a temperature sensor; and
    a process sensor.

2. The integrated module of claim 1, wherein the buffer stage comprises an operational amplifier.

3. The integrated module of claim 1, wherein the voltage divider comprises a resistor and a capacitor such that a value of the resistor can be changed to cut off voltage division above a desired frequency.

4. A method for monitoring circuit performance using an integrated module, comprising:
    monitoring a voltage, comprising:
        dividing a voltage based on a resistor to generate a divided voltage signal, wherein a value of the resistor can be changed to cut off voltage division above a desired frequency,
        buffering the divided voltage signal to produce a buffered divided voltage signal, and
        selectively outputting the buffered divided voltage signal;
    monitoring a temperature; and
    monitoring a process corner.

5. The method of claim 4, further comprising:
    positioning the integrated module on a section of the circuit to monitor the temperature, the voltage, and the process corner at the section.

6. A method for monitoring circuit performance using an integrated module, comprising:
    monitoring a voltage, wherein monitoring the voltage comprises:
        dividing a voltage based on a resistor to generate a divided voltage signal, wherein a value of the resistor can be changed to cut off voltage division above a desired frequency;
        buffering the divided voltage signal to produce a buffered divided voltage signal, wherein the buffered divided voltage signal represents a voltage value on a section of the circuit where the integrated module resides;
        selectively outputting the buffered divided voltage signal;
    monitoring a temperature; and
    monitoring a process corner.

7. An on-chip integrated testing module, comprising:
    a voltage sensor component, comprising:
        an input stage, wherein the input stage comprises a voltage divider, and wherein the input stage generates a divided voltage signal based on the voltage divider,
        a buffer stage, wherein the buffer stage inputs the divided voltage signal and outputs a buffered divided voltage signal, and
        an output stage, wherein the output stage comprises a transmission gate, and wherein the output stage inputs the buffered divided voltage signal and outputs the buffered divided voltage signal based on the transmission gate;
    a temperature sensor component; and
    a process sensor component,
    wherein data received from at least one selected from the group consisting of the voltage sensor component, the temperature sensor component, and the process sensor component is used to check performance of an integrated circuit in which the on-chip integrated testing module resides.

8. The on-chip integrated testing module of claim 7, wherein the on-chip integrated testing module is used to debug the integrated circuit.

9. An on-chip integrated module, comprising:

means for measuring a voltage, comprising:
 means for dividing a voltage based on a resistor to generate a divided voltage signal, wherein a value of the resistor can be changed to cut off voltage division above a desired frequency,
 means for buffering the divided voltage signal to produce a buffered divided voltage signal, and
 means for selectively outputting the buffered divided voltage signal;

means for measuring a temperature; and means for measuring a process corner.

* * * * *